(12) United States Patent
Kato et al.

(10) Patent No.: US 6,273,620 B1
(45) Date of Patent: Aug. 14, 2001

(54) SEMICONDUCTOR LIGHT EMITTING MODULE

(75) Inventors: Takashi Kato; Goro Sasaki; Manabu Shiozaki, all of Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/384,405

(22) Filed: Aug. 27, 1999

(30) Foreign Application Priority Data

Aug. 27, 1998 (JP) .................................................. 10-241665

(51) Int. Cl.[7] ....................................................... G02B 6/36
(52) U.S. Cl. .................................... 385/88; 385/37; 372/6
(58) Field of Search ................................ 385/88–94, 37; 372/6

(56) References Cited

U.S. PATENT DOCUMENTS

| | | | |
|---|---|---|---|
| 5,485,481 | 1/1996 | Ventrudo et al. | 372/6 |
| 5,659,559 | 8/1997 | Ventrudo et al. | 372/6 |
| 5,715,263 | 2/1998 | Ventrudo et al. | 385/94 |
| 5,717,804 | 2/1998 | Pan et al. | 385/94 |
| 5,724,377 | 3/1998 | Huang | 372/98 |
| 5,845,030 | * 12/1998 | Sasaki et al. | 385/88 |
| 5,930,430 | * 7/1999 | Pan et al. | 385/94 |

* cited by examiner

*Primary Examiner*—Phan T. H. Palmer
(74) *Attorney, Agent, or Firm*—McDermott, Will & Emery (57) ABSTRACT

A fiber grating laser module comprises a semiconductor optical amplifier and a grating fiber in which a Bragg grating is formed in the core. The semiconductor optical amplifier provides a wave guide in which the light is generated and amplified by the carrier injection, the light emitting facet and the light reflecting facet. The Bragg grating in the grating fiber and the light reflecting facet of the semiconductor amplifier forms an optical resonator. The subject of the invention is that the reflectance of the Bragg grating at the Bragg diffraction wavelength is greater than 60%.

4 Claims, 7 Drawing Sheets

SEMICONDUCTOR LIGHT EMITTING MODULE

BACKGROUND OF THE INVENTION

1. Field of the Invention

The present invention relates to a semiconductor laser module with a grating fiber within which a Bragg grating is formed, and particularly relates to a module with an excellent high frequency performance.

2. Related Background Art

Wavelength division multiplex (WDM) systems for optical communication have been attractive because of abrupt increasing of information to be transmitted. Minimum interval to the neighboring wavelength in the WDM system is set to be 0.8 nm by ITU standard (International Telecommunication Unit). Distributed feedback laser diodes (DFB-LD) with an Mach-Zender type external modulator made of lithium niobate have been used as a light source for such a WDM system because of its sharp oscillation spectrum. In DFB-LD, the oscillation wavelength is determined by the Bragg grating formed within the laser chip.

A semiconductor optical amplifier with a grating fiber, which is called fiber grating laser, has been also attractive. The device comprises a semiconductor optical amplifier and a grating fiber within which a Bragg grating is formed in its core portion. The amplifier and the grating fiber are arranged so that the one facet of the amplifier and the Bragg grating make an optical resonator.

In the WDM system, the wavelength interval is set to be 0.8 nm as mentioned above, then the fiber grating laser is superior to the DFB-LD because the oscillation wavelength is primarily defined by the fiber grating and is adjusted independently of the semiconductor optical amplifier. However, the fiber grating laser has less performance than DFB-LD at high operating frequencies because the length of the optical resonator is longer than that of DFB-LD.

In the semiconductor optical amplifier driven with a high frequency signal, carriers in the active layer of the semiconductor is also affected by the signal. The variation of the carrier density causes the alteration of the refractive index in the active layer, the effective length of the optical resonator, and the oscillation wavelength responds dynamically to the signal frequency. Consequently, the width of oscillation spectrum (FWHM: Full width at Half Maximum) increase. This phenomenon is known as chirping. An optical source with a wider oscillation spectrum is inappropriate for the WDM system.

SUMMARY OF THE INVENTION

In order to solve the problem above mentioned, it is an object of the present invention to provide a fiber grating laser module which has a stable oscillation wavelength at high frequencies and an improved chirping characteristics.

A fiber grating laser module according to the present invention comprises a semiconductor optical amplifier and an optical fiber in which the Bragg grating is formed. The semiconductor optical amplifier provides an optical wave-guide in which light is generated and is amplified by the carrier injection and the optical wave-guide provides a light emitting facet and a light reflecting facet opposing to the emitting facet. A light incident facet of the optical fiber is optically coupled to the light emitting facet of the semiconductor optical amplifier. Therefore, the Bragg grating in the optical fiber and the light reflecting facet forms an optical resonator so as to resonate the light generated and amplified in the optical wave-guide of the semiconductor optical amplifier. The subject of the present invention is that the reflectance of the Bragg grating is larger than 60% at the Bragg diffraction wavelength.

It is preferred in the present invention that the optical wave-guide extends along the axis connecting the light emitting facet and the light reflecting facet of the semiconductor optical amplifier, and the angle between the axis and the normal of the light emitting facet is a predetermined value larger than zero.

The fiber grating laser module of the present invention is preferable to form the light incident facet of the optical fiber so as to focus the light from the light emitting facet of the semiconductor optical amplifier onto the fiber core.

Further scope of applicability of the present invention will become apparent form the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

In the course of the following detailed description, reference will be made to the attached drawings in which.

DETAILED DESCRIPTION OF THE REFERRED EMBODIMENTS

Detailed description of the present invention will be described referring to the accompanying drawings. Constituents identical to each other or those having functions identical will be referred to with numerals of letters identical to each other without repeating their over lapping explanations.

Figure 1A:
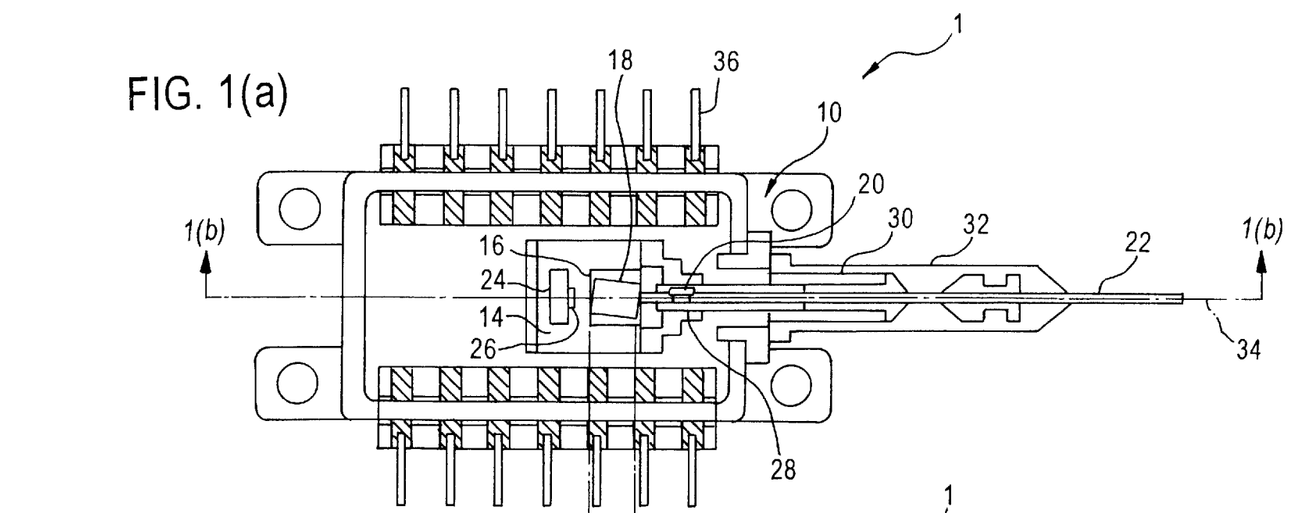
FIG. 1(a) is a plan view showing the fiber grating laser module and FIG. 1(b) is a cross-sectional view taken on the line A–A' of FIG. 1(a)
Figure 1B:
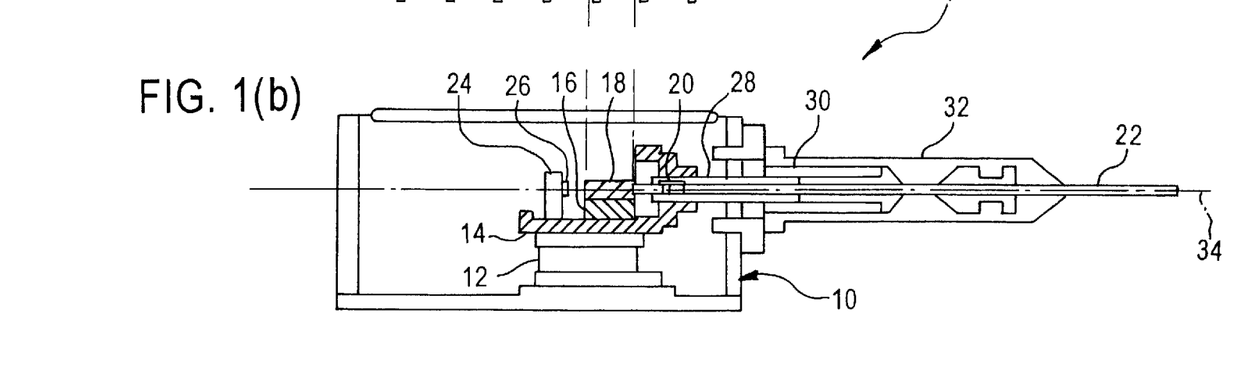

FIG. 1(a) is a plane view showing the fiber grating laser module 1 and FIG. 1(b) is a cross-sectional view taken on the line A–A' of FIG. 1(a). According to FIG. 1(a) and FIG. 1(b), a primary portion of the fiber grating laser module 1 is installed within a butterfly-typed package 10. One side of the package 10 provides a grating fiber 22 and its supporting members 30, 34. A plurality of lead terminals 36 is drawn out from the side of the package 10. A bottom plate of the package is made of a conducting material and a Peltier element 12 is installed thereon. The lower plate of the Peltier element is contacted to the bottom plate of the package 10. Peltier element operates as a heating/cooling element by Peltier effect. The current is supplied from the outside through the lead terminals. On the upper plate of the Peltier element is provided a supporting member 14 made of a conducting material and chip carriers 16, 24, thereon.

It is favorable that the tip of the grating fiber 22 opposing to the semiconductor amplifier 18 has a light focusing function to increase the coupling efficiency between the semiconductor amplifier 18 and the grating fiber 22. The shape of the tip to focus the light is curved surface with a constant curvature, combination of curved surfaces with different curvature, combination of planes and the like. Etching, polishing or melting are able to process the tip of the fiber.

Using the tip rounded fiber makes it possible to effectively focus the light from the semiconductor amplifier 18 to the core of the grating fiber 22 without inserting another lens between the semiconductor amplifier 18 and the fiber 22. To couple the semiconductor amplifier 18 to the grating fiber 22 directly can improve the high frequency performance of the module because the resonator length is held short.

A Bragg grating is formed in a predetermined position in the core apart from the tip of the fiber 22. The fiber 22 comprises the core containing germanium by a predetermined concentration and the cladding, the refractive index of which is smaller than that of the core. The Bragg grating is characterized by the periodical alteration of the refractive index, which is one kind of wavelength selective reflector, and formed by irradiating ultraviolet rays to the core. The method of forming the Bragg grating is disclosed, for example, in U.S. Pat. No. 4,725,110.

Thus processed fiber has a distinctive maximum reflectance, reflection spectral width, and the physical length of the Bragg grating. An example of the characteristics of the grating is, Maximum reflectivity: 80% at 1.55 $\mu$m Spectral width: 0.2 nm at half maximum Physical length: 5 mm.

The grating fiber 22 is inserted into a center bore of the ferule 28 and a predetermined length from the end surface of the ferule 28 extrudes the tip portion of the fiber 22. The sleeve 30 holds ferule 28 and is fixed to the side wall of the package 10.

A supporting member 14 also holds the ferule 28 on the Peltier element 12. Thus, the mutual position is attained to align the tip of the grating fiber 22 to the facet of the semiconductor amplifier 18 so as to optically couple the semiconductor amplifier 18 to the Bragg grating.

A photo diode (PD) 26 is mounted on the chip carrier 24. Light receiving facet of the PD faces the opposing facet to the one facing the grating fiber 22. The PD operates as a device for monitoring the light output power of the semiconductor amplifier 18 and is electrically connected to the lead terminals 36. The resulting signal of monitoring is lead out through the lead terminals 36.

On the other hand, a semiconductor amplifier 18 is installed on the chip carrier 16 made of a heat conducting material, such as aluminum nitride (AlN) or aluminum oxide ($Al_2O_3$), and cooled by the Peltier element 12 through the chip carrier 16, then thermally compensated. The one facet of the semiconductor amplifier 18 is optically coupled to the grating fiber 22. In the present embodiment, the semiconductor amplifier 18 is set so as to tilt the facet of the amplifier 18 to the optical axis 34 of the grating fiber 22 because the wave-guide of the amplifier 18 is oblique to the facet.

Since the semiconductor amplifier 18 is mounted on the Peltier element 12, its operation temperature is held within a range so as not to cause the mode hopping. Moreover the grating fiber 22 is also mounted on the Peltier element 12 through the supporting member 14 and the ferrule 28. Accordingly, both the semiconductor amplifier 18 and the grating fiber 22 are held constant and almost same temperature to each other. Decline of the optical coupling efficiency between the amplifier 18 and the grating fiber 22 due to the fluctuation of the physical dimension by the temperature change can be eliminated.

Figure 2:
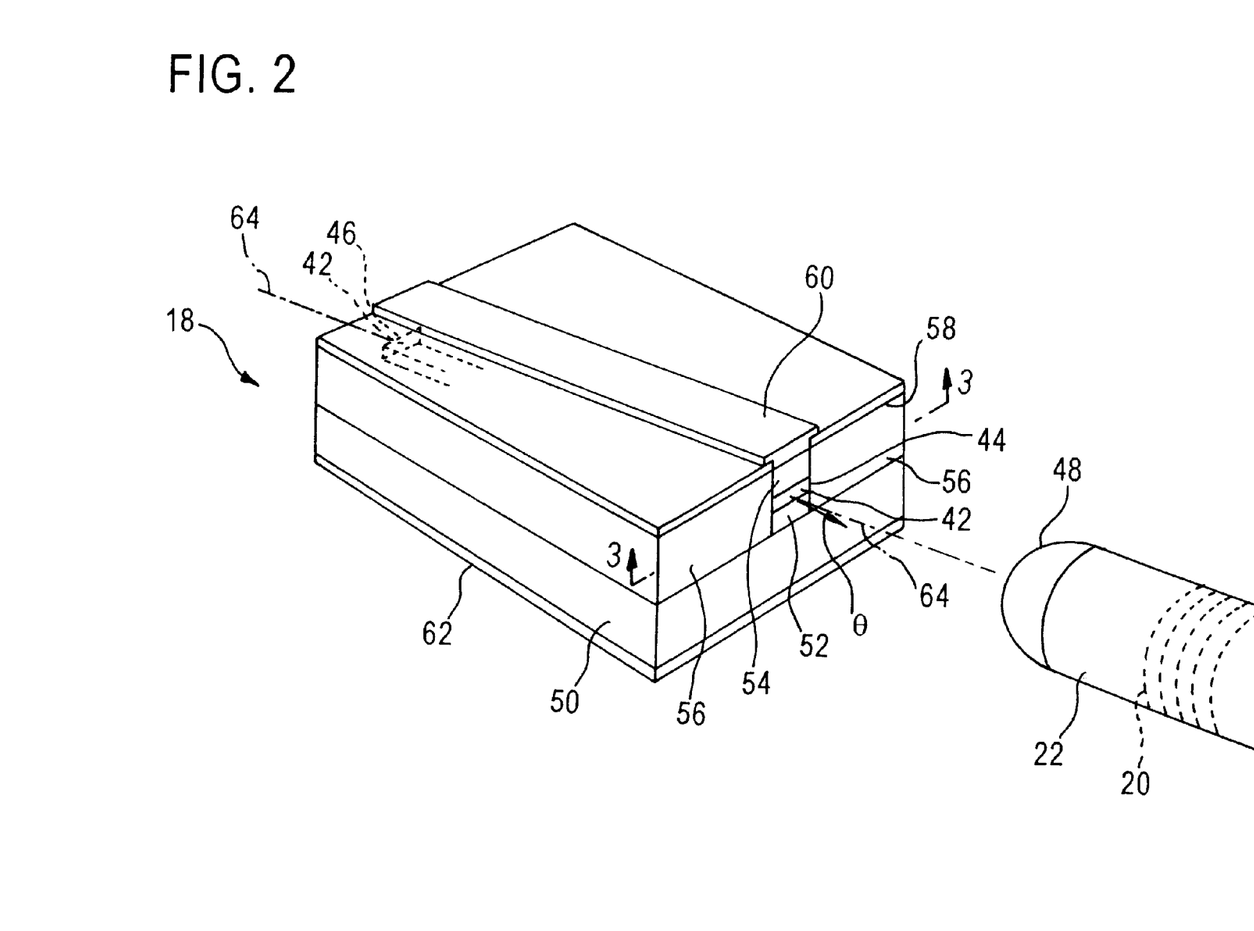
FIG. 2 is perspective view showing the semiconductor optical amplifier and the grating fiber used in the fiber grating laser module shown in FIG. 1(a) and FIG. 1(b)

FIG. 2 is perspective view showing the semiconductor amplifier 18 and the grating fiber 22 used in the fiber grating laser module shown in FIG. 1.

Referring to FIG. 2, the semiconductor amplifier provides an optical wave guide 42 for generating and amplifying the light by injecting carriers. The wave-guide 42 is sandwiched by a light emitting facet 44 and a light reflecting facet 46. The light emitting facet opposes the end facet of the grating fiber 22 while light reflecting facet opposes the light receiving facet of the PD.

The wave guide 42 provides an optical axis 64. In the figure, the light emitting facet 44 and the light reflecting facet 46 of the wave guide is substantially parallel to each other and the angle between the optical axis 64 of the wave guide and the normal of each facet is $\theta$ which is greater than or equal to zero.

The semiconductor amplifier thus configured is, for example, InGaAsP/InP with a double-hetero laminate structure. An n-type Inp lower cladding layer 52, an un-doped GaInAsP wave guiding layer 42, and a p-type InP upper cladding layer 54 are successively grown on an InP substrate. These layers form a mesa stripe. Current blocking layers 56 is formed so as to place the mesa stripe therebetween, that is, mesa stripe is buried by the current blocking layers 56. On the current blocking layer 56, an insulating layer 58 is formed so as to expose the surface of the upper cladding layer 54. The p-type electrode 60 is formed onto the upper cladding layer while the n-type electrode 62 is formed onto the other surface of the InP substrate.

The multiple quantum well (MQW) structure or the like is applicable for the wave guide layer 42. Separated confinement hetro-structure (SCH), which separates the carrier confinement layer and the light confinement layer, is also applicable. Materials and structures of the wave guide layer are selected based on the wavelength to be emitted. The wave guide layer is surrounded by the lower cladding layer 52, upper cladding layer 54, and a pair of the current blocking layer 56. Since refractive index of these layers 52, 54, and 56 are lower than that of the wave guide layer 44, light confinement is effectively attained in the wave guide layer 44.

The light emitting facet 44 is cleaved surface of the semiconductor. The normal of the facet 44 is favorable to make an angle $\theta$ to the optical axis of the semiconductor amplifier 64 because undesirable reflection between the emitting facet 44 and the reflecting facet 66 can be eliminated. Moreover, an anti-reflection film is coated on the light emitting facet 44. From 7° to 15° are generally selected for the angle $\theta$. Silicon Nitride (SiN) is used for the anti-reflection film. By coating the anti-reflection film, the reflectance at the emitting facet is lowered to the order of $10^{-3}$. By setting the angle to be 7° in addition to the anti-reflection film. the reflectance of the emitting facet can be lowered to $10^{-5}$.

The light reflecting facet 46 is also cleaved surface of the semiconductor. The angle $\theta$ between the normal of the facet 46 and the optical axis 64 is held to be zero to enhance the reflectance. In the FIG. 3, although the angle θ is the same as that of the emitting facet because of the productivity of the semiconductor amplifier 18, each angle at the emitting facet and the reflecting facet can be independently defined. The light reflecting facet is coated by the high reflection film made of multi-layered SiN and amorphous silicon.

Figure 3:
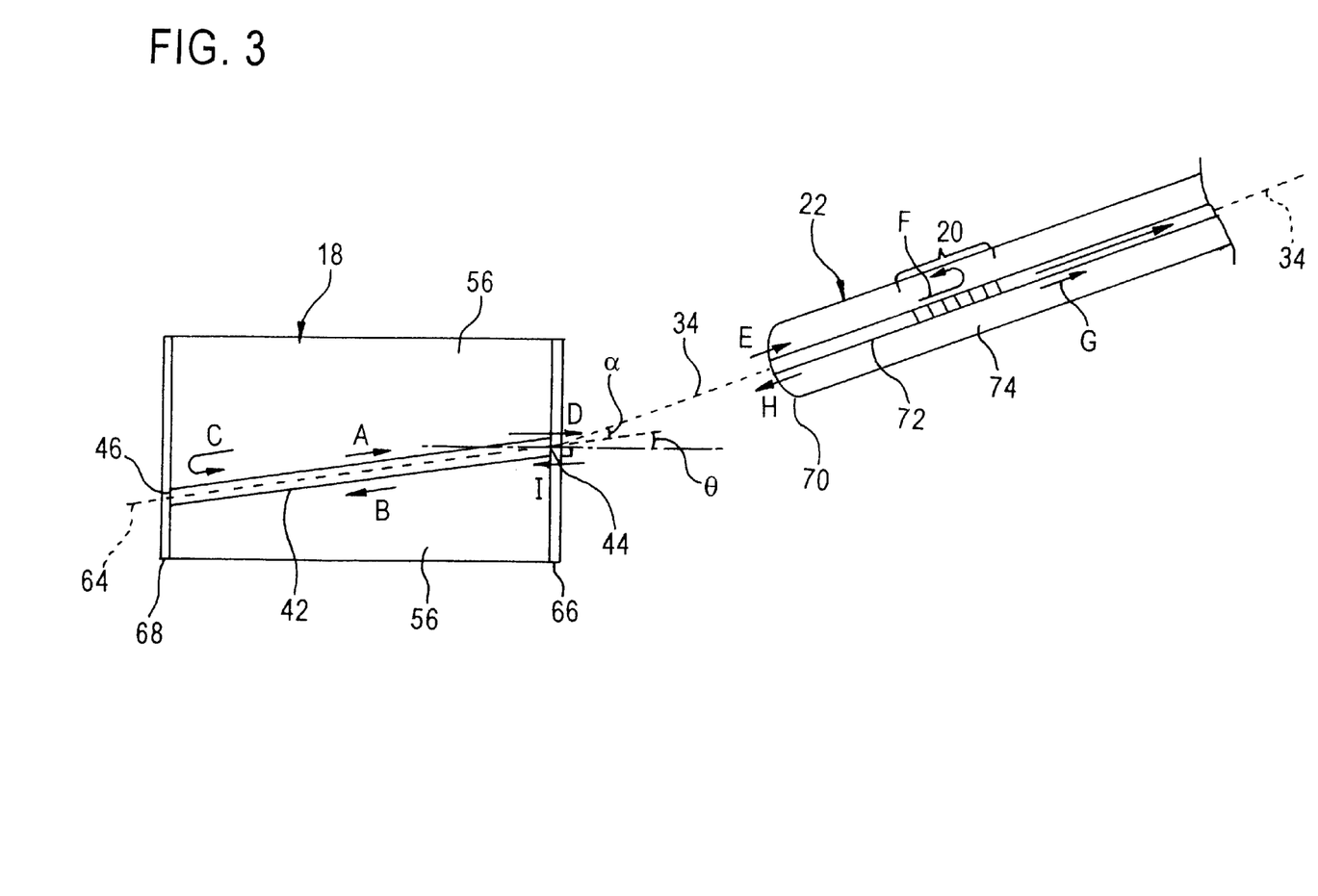
FIG. 3 is the horizontal sectional view of FIG. 2.

Next is the operation of the semiconductor amplifier 18. FIG. 3 is the horizontal sectional view of FIG. 2. The semiconductor amplifier in FIG. 3 provides the anti-reflecting film 66 and the high reflection film 68.

Referring to FIG. 3, while the grating fiber 22 is along the optical axis 34, the wave guide 42 is along to the axis 64 which makes an angle θ to the normal of the emitting facet 44. The tip 70 of the grating fiber 22 is apart from the emitting face 44. The axis 34 makes an angle α to the axis 64, which is determined by the Snell's law at the light emitting facet.

Spontaneous emissions with a wavelength are generated by the carrier injection. The emission is confined in the wave guide 42 and propagates along the wave guide 42, which is denoted by arrows A and B in FIG. 3. While the emission is reflected in the light reflecting facet 46 (arrow C), nearly whole entity is transmitted in the light emitting facet (arrow D). The transmitted emission D arrives the tip of the grating fiber 22 and is focused to the core 72 by the rounded surface. In the grating fiber 22, since the core 72 is surrounded by the clad 74 whose refractive index is lower than that of the core 72, the light is effectively confined and propagated within the core 72. Once arriving at the Bragg grating 20, the portion of the light, its wavelength is selected by the Bragg refractive condition and its magnitude is determined by the reflectance of the Bragg grating, is reflected backward to the semiconductor amplifier 18 (arrow F). The light reflected by the Bragg grating returns within the wave guide 42 passing through the tip of the grating fiber 22 and the light emitting facet 66 and causes a stimulated emission. The rest portion of the light not selected and reflected by the Bragg grating propagates along the core 72 and output as a laser light.

Figure 4:
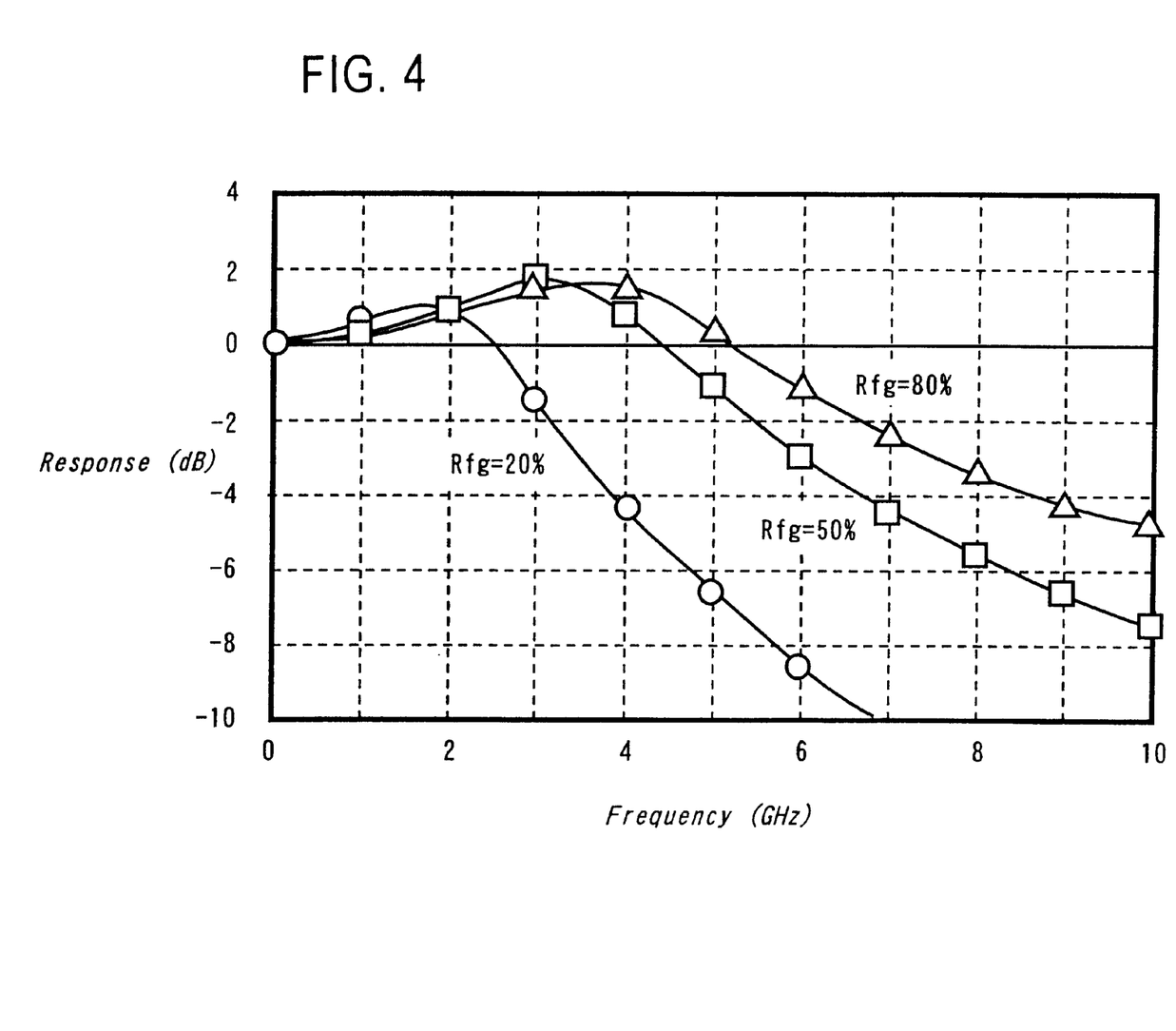
FIG. 4 shows a modulation characteristics of the fiber grating laser module with various reflectance of the Bragg grating.
Figure 5:
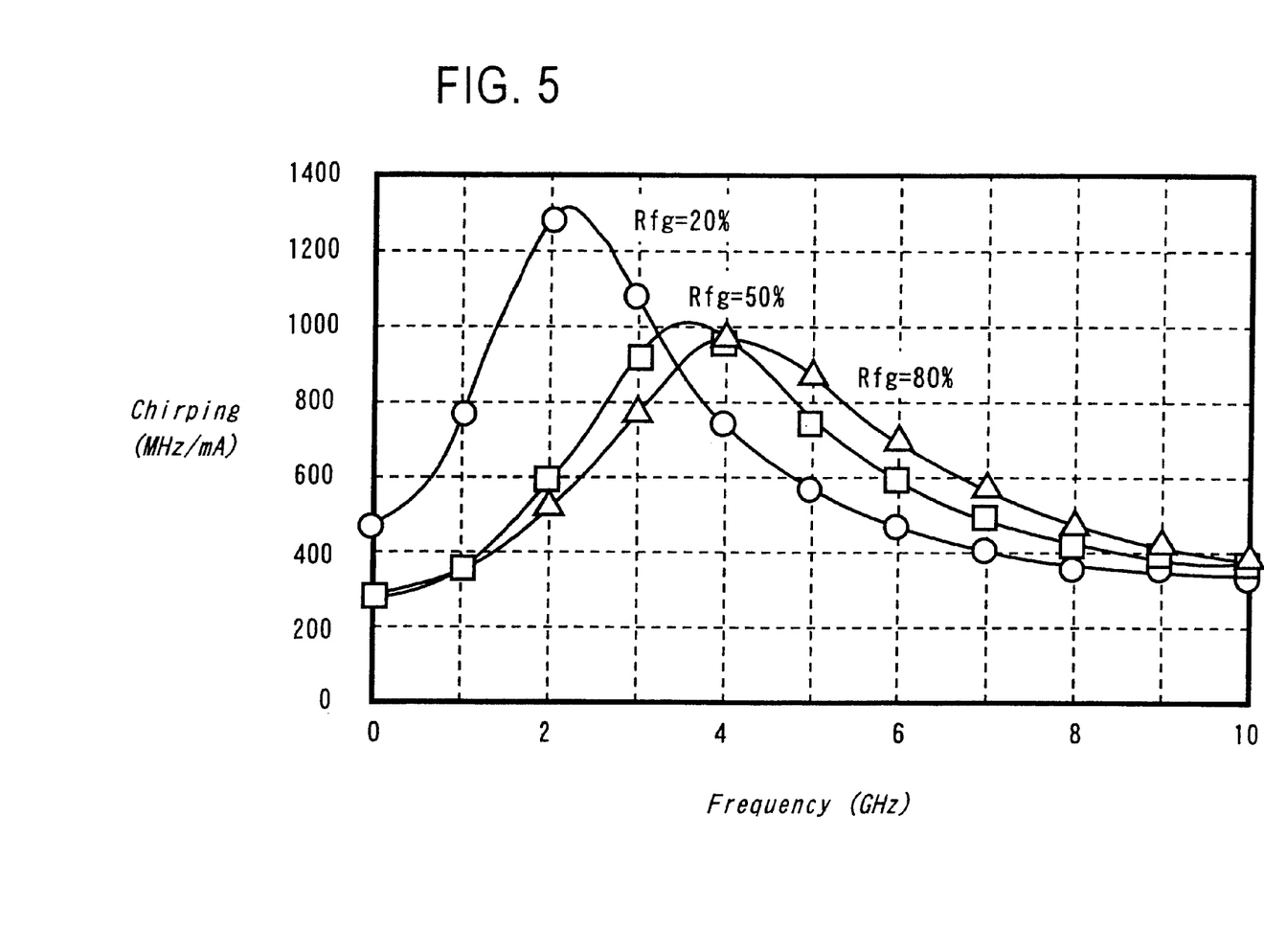
FIG. 5 shows the chirping characteristics of the fiber grating laser module.
Figure 6:
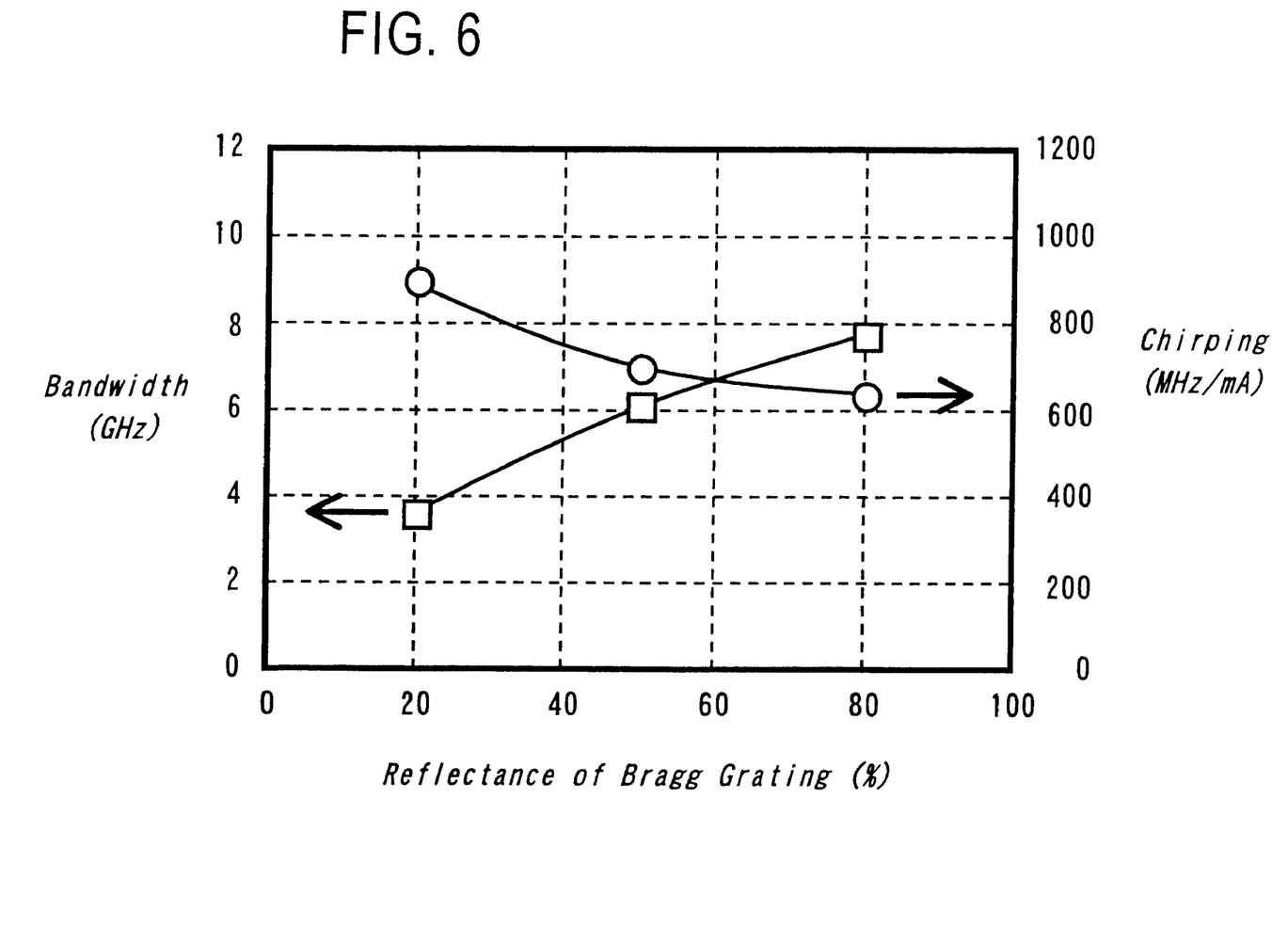
FIG. 6 shows the dependence of the frequency bandwidth and the maximum chirping to the reflectance of the Bragg grating.

Next are characteristics of the fiber grating laser module of the present invention referring to FIGS. 4 to 6.

FIG. 4 shows modulation characteristics of the fiber grating laser module with various reflectance of the Bragg grating. The abscissa denotes the modulation frequency in the unit of GHz, while the vertical axis denotes the frequency response of the module in the unit of dB. In this figure, frequency responses of the fiber grating laser module were measured when the semiconductor optical amplifier was modulated at the 0.1% modulation of the bias current. In FIG. 4, results are shown for the module with the Bragg grating reflectance of 20%, 50%, and 80%, respectively. While about 3 GHz bandwidth for the 20% reflectance and about 6 GHz bandwidth for the 50% reflectance, it increases to about 7.5 GHz for the 80% reflectance, where the bandwidth is the frequency where the frequency response decrease −3 dB to the DC (0 GHz).

FIG. 5 shows the chirping characteristics of the fiber grating laser module. The abscissa also denotes the modulation frequency in the unit of GHz and the chirping of the optical emission spectrum in the unit of MHz/mA is on the vertical axis. The chirping characteristics were obtained by measuring the increase of the half-width of the emission spectrum when the semiconductor optical amplifier was modulated at 0.1% of the bias current. In FIG. 5. the maximum chirping was about 900 MHz/mA at 2 GHz for the 20% reflectance of the Bragg grating, about 720 MHz/mZ at 3.5 GHz for the 50% reflectance, and about 4 GHz for the 80% reflectance, respectively. Thus, not only the chirping is decreased but also the frequency where the chirping becomes the maximum is increased, as the reflectance of the Bragg grating becomes large.

FIG. 6 shows the dependence of the frequency bandwidth and the maximum chirping to the reflectance of the Bragg grating obtained from FIG. 4 and FIG. 5. Although the bandwidth further increases in the region where the reflectance is over 60%, the decrease of the maximum chirping almost reaches the limit of about 700 MHz/mA. If the reflectance of the Bragg grating is set no fewer than 60%, then the chirping can be effectively decreased.

Figure 7:
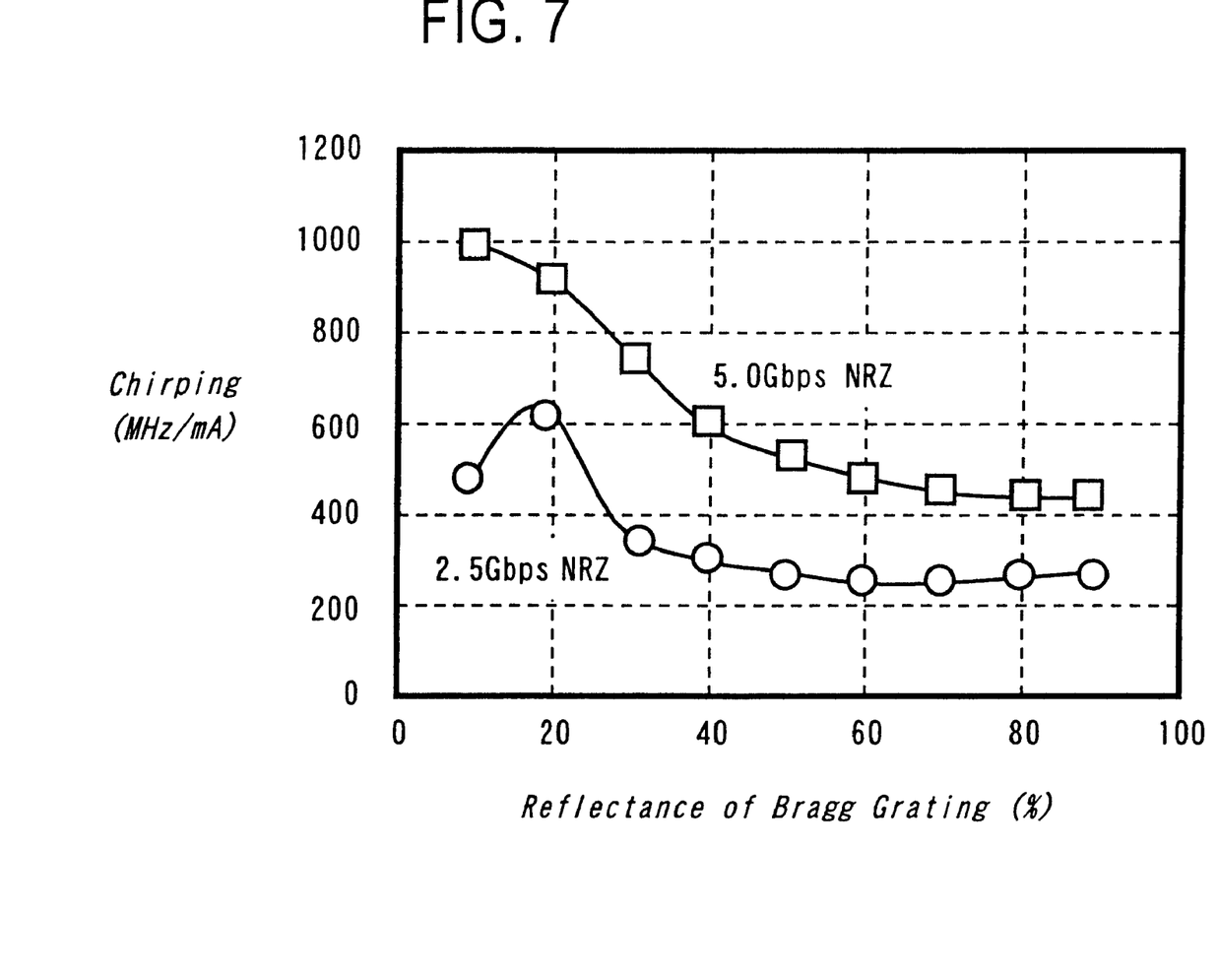
FIG. 7 shows the dependence of the maximum chirping to the reflectance of the Bragg grating at non-return-to-zero signal.

FIG. 7 shows the dependence of the chirping at 2.5 Gbps and 5.0 Gbps to the reflectance of the Bragg grating, where signals applied to the semiconductor optical amplifier are pseudo random pattern of non-return-to-zero form at each frequency and the magnitude of the modulation is 0.1% of the bias current. Similar to FIG. 6, the chirping decreases in the region where the reflectance exceeds 60%. FIG. 7 shows that using the Bragg grating, the reflectance of which is greater than 60%, and even at 5 Gbps transmission, gives the superior chirping to the 20% reflectivity at 2.5 Gbps.

The bias current of the semiconductor optical amplifier is limited to about 100 mA at most due to heating effects. Permissible width of the emission spectrum is 25 GHz in the WDM system with 50 GHz frequency span, then, the chirping must be lower than about 0.25 GHz/mA (25 GHz/100 mA). Therefore, the fiber grating laser module applicable to the WDM system with 50 GHz frequency span and the 2.5 Gbps transmission speed is realizable by setting the reflectance of the Bragg grating greater than 60% according to the present invention.

In the fiber grating laser module, it has been common practice that to enhance the reflectance of the Bragg grating formed in the optical fiber is undesirable because of the decrease of the output optical power. However, taking the bandwidth expansion as the reflectance of the grating become large in to account, which is equivalent to raise the relaxation oscillation frequency of the laser, present invention provides the light source suitable for the WDM system.

From the invention thus described, it will be obvious that the invention may be varied in many ways. Such variations are not to be regarded as a departure form the spirit and scope of the invention, and all such modifications as would be obvious to one skilled in the art are intended for inclusion within the scope of the following claims.

What is claimed is:

1. A light emitting module comprising:

a semiconductor optical amplifier providing an optical wave-guide, said wave-guide having a light emitting facet and a light reflecting facet opposing to said light emitting facet; and an optical fiber providing a Bragg grating within a core and a light incident facet, said light incident facet opposing and being optical coupled to said light emitting facet of said semiconductor optical amplifier, said Bragg grating having a Bragg diffraction wavelength, said Bragg grating and said light reflecting facet of said semiconductor optical amplifier forming a light resonator, wherein said Bragg grating has reflectance greater than 60% at said Bragg difractive wavelength.

2. A light emitting module according to claim 1, wherein said optical wave-guide extends along an axis connecting said light emitting facet and said light reflecting facet of said semiconductor optical amplifier, said axis forming an angle larger than zero to the normal of said light emitting facet of said amplifier.

3. A light emitting module according to claim 1, wherein said light incident facet is formed so as to focus the light emitted from said light emitting facet of said semiconductor optical amplifier.

4. A light emitting module according to claim 1, wherein said light emitting facet of said semiconductor optical amplifier provides an anti-reflection coating.

* * * * *